United States Patent [19]

Blanchard

[11] Patent Number: 4,978,631
[45] Date of Patent: Dec. 18, 1990

[54] CURRENT SOURCE WITH A PROCESS SELECTABLE TEMPERATURE COEFFICIENT

[75] Inventor: Richard A. Blanchard, Los Altos, Calif.

[73] Assignee: Siliconix Incorporated, Santa Clara, Calif.

[21] Appl. No.: 890,218

[22] Filed: Jul. 25, 1986

[51] Int. Cl.$^5$ ............................................. H01L 21/265
[52] U.S. Cl. ....................................... 437/24; 437/37; 357/23.12
[58] Field of Search ......................... 29/571; 357/23.12; 148/187; 307/296 R, 297; 437/24, 37

[56] References Cited

U.S. PATENT DOCUMENTS

| | | | |
|---|---|---|---|
| 3,328,210 | 6/1967 | McCaldin et al. | 148/1.5 |
| 3,657,575 | 4/1972 | Taniguchi et al. | 307/297 |
| 3,760,199 | 9/1973 | Graeme | 307/296 |
| 4,270,081 | 5/1981 | Hareyama | 307/297 |

FOREIGN PATENT DOCUMENTS 0166231  5/1985  European Pat. Off. .
2028582  3/1980  United Kingdom .

OTHER PUBLICATIONS

IBM Technical Disclosure Bulletin, "Tunable Flatband ... Oxide", vol. 28, No. 7, Dec. 1985, pp. 3008-3009.
Krusin-Elbaum et al., "Correlation of Negative and Positive Shifts in the Threshold Voltage with the Distribution of Iodine in $SiO_2$", Jun., 1985, Device Research Conference, Boulder, CO.
Kazerounian et al., "CODMOS—A Depletion MOSFET Using Fixed Oxide Charge", 41st Annual Device Research Conference, IEEE Electron Devices Society, Jun. 20-22, 1983.
Blanchard et al., U.S. Patent Application Ser. No. 06/771,444 entitled "Method for Shifting the Threshold Voltage of DMOS Transistors".
"MOSpower Applications Handbook", edited by Severns et al., published by Siliconix Incorporated in 1984, pp. 5-9 to 5-14.

Primary Examiner—Olik Chaudhuri
Assistant Examiner—M. Wilczewski
Attorney, Agent, or Firm—Skjerven, Morrill, MacPherson, Franklin & Friel

[57] ABSTRACT

A transistor (Q3, Q4) is configured to act as a current source. Of importance, the current provided by the current source has a process-selectable temperature dependence. By introducing ions into the transistor gate insulation (14, 20) the current provided by the current source can be either temperature independent, inversely related to temperature, or directly related to temperature, as desired.

10 Claims, 4 Drawing Sheets

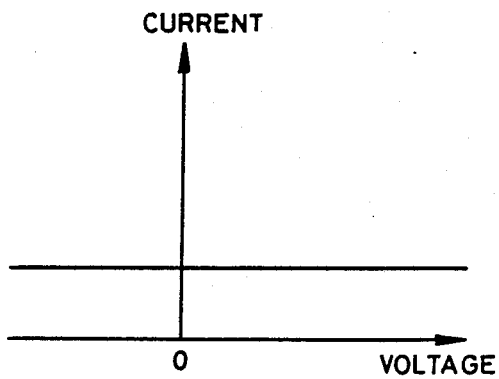
FIG._1.
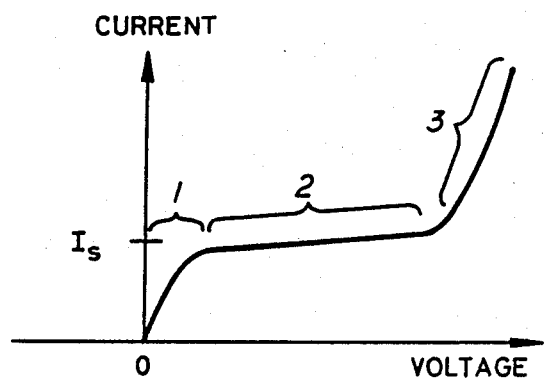
FIG._2.
(PRIOR ART)
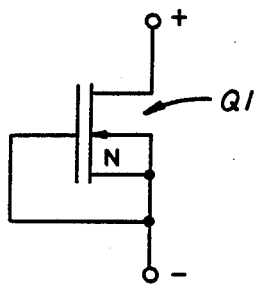
FIG._3a.
(PRIOR ART)
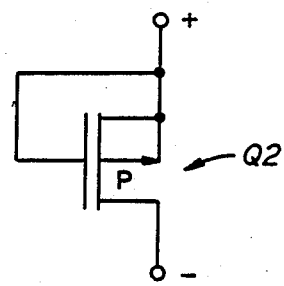
FIG._3b.
(PRIOR ART)
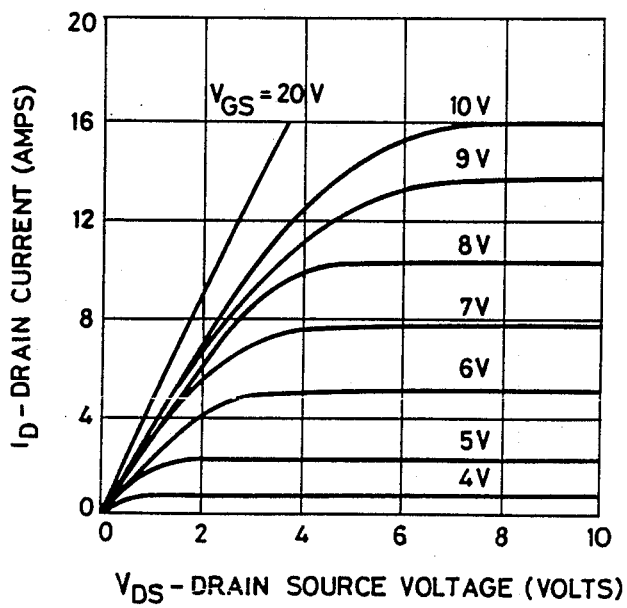
FIG._4.
(PRIOR ART)

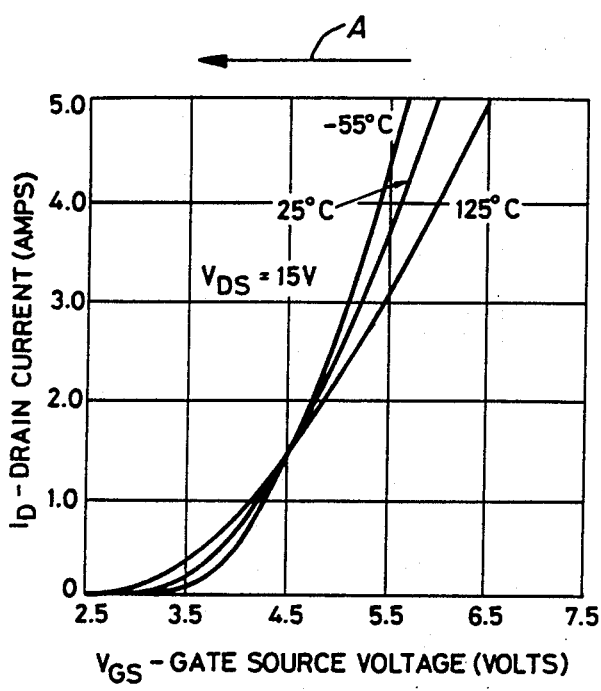
FIG._5.
(PRIOR ART)
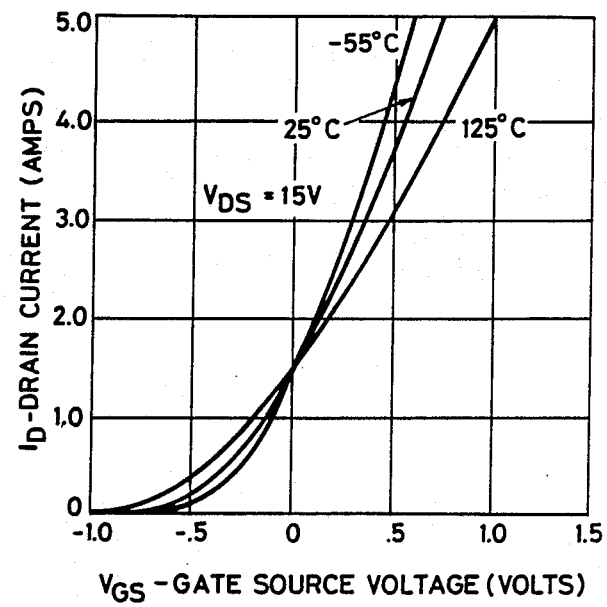
FIG._6.
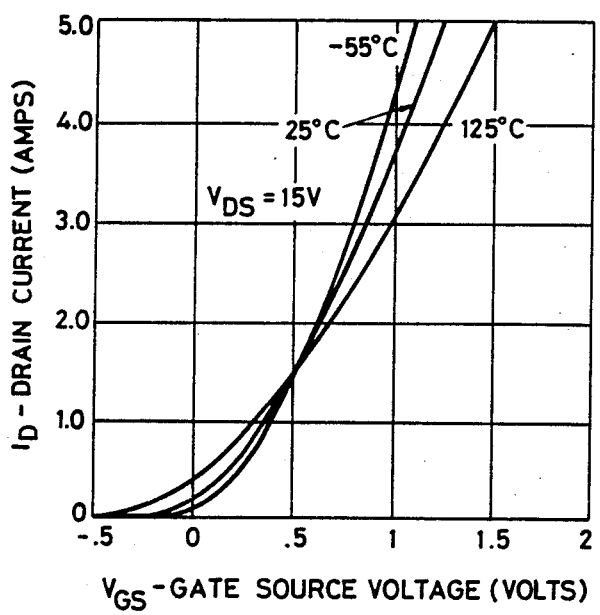
FIG._7.
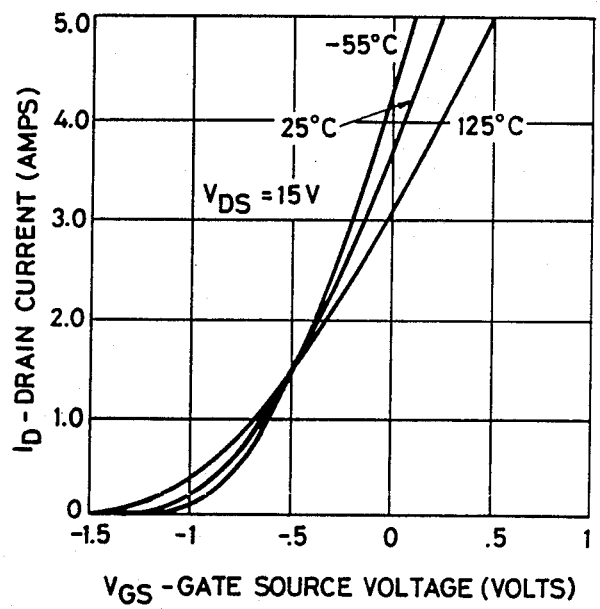
FIG._8.

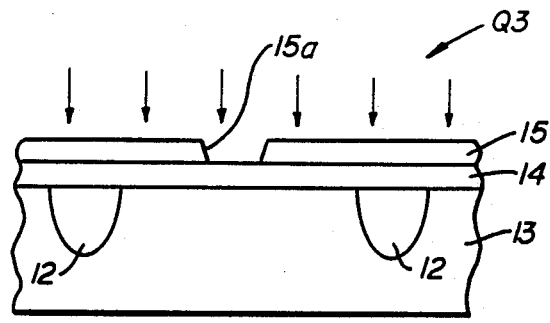
FIG._9a.
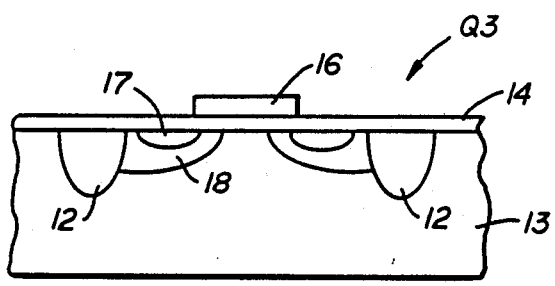
FIG._9b.
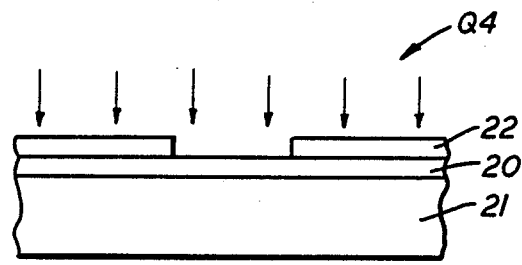
FIG._10a.
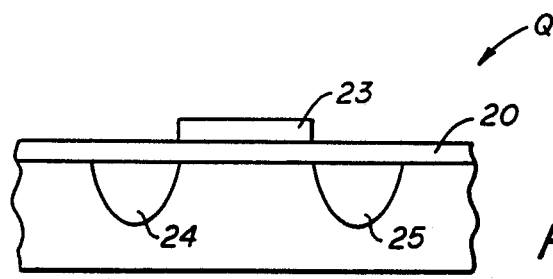
FIG._10b.
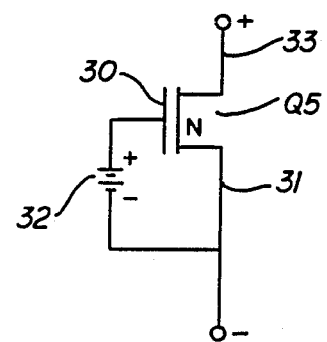
FIG._11.

CURRENT SOURCE WITH A PROCESS SELECTABLE TEMPERATURE COEFFICIENT

BACKGROUND OF THE INVENTION

This invention relates to current sources and more specifically to current sources having a process selectable temperature coefficient.

FIG. 1 illustrates the current versus voltage (IV) characteristic curve for an ideal current source. As is known in the art, it is impossible to build an ideal current source and therefore the best that can be obtained is an approximation of the curve of FIG. 1. FIG. 2 illustrates the IV characteristic curve of a typical current source manufactured using conventional components. As can be seen, the curve of FIG. 2 includes a first region 1 in which current first increases from zero amperes to a desired current $I_s$, a second region 2 in which the current only varies minimally as a function of voltage, and a region 3 in which current increases in response to an excessive voltage applied across the current source.

A typical current source which provides an IV characteristic such as the curve of FIG. 2 is a depletion mode MOS field effect transistor (MOSFET) Q1 illustrated in FIG. 3a. MOSFET Q1 is an N-channel transistor. A current source using a depletion mode P-channel transistor is illustrated in FIG. 3b. As is known in the art, transistors Q1 and Q2 will each conduct a constant current and thus serve as a current source when a voltage exceeding the transistor pinch-off voltage is applied across their source and drain.

It is also known in the art to manufacture current sources using DMOS transistors. (A DMOS transistor is a transistor in which the transistor channel length is defined by the difference in diffusion of sequentially introduced impurities from a common edge or boundary. DMOS transistors are described. for example, in "Power MOS Devices in Discrete and Integrated Circuits" by Plummer et al., published by Stanford University in 1984 and incorporated by reference.) Such current sources operate in a manner similar to MOSFET current sources.

Because typical current sources are designed using MOSFETs or DMOS FETs, the output current of such current sources is also typically dependent upon temperature. In many applications, however, it is desirable to have a current source which is either temperature independent or has a selected temperature dependence.

SUMMARY

A current source constructed in accordance with my invention provides an output current which is dependent upon temperature in a selectable manner. In one embodiment, the current provided by the current source is temperature independent. In another embodiment, the current provided by the current source is dependent upon temperature in a known and selected manner. The current source typically includes a depletion mode transistor in which the source is electrically coupled to the gate. In accordance with one novel feature of my invention, ions are implanted into the gate insulation of the transistor during the transistor manufacturing process. The implanted ions retain their electrical charge after implantation, and therefore create an electrical field which shifts the drain current versus gate-source voltage characteristic curve of the transistor. Of importance, the extent of the shifting of this curve is temperature-independent.

There is typically one gate-source voltage on the drain current versus gate-source voltage curve for which drain current is temperature-independent, i.e. for one specific gate-source voltage, the corresponding drain current does not change in response to temperature. By shifting the curve (by implanting ions into the gate insulation) so that this point occurs at a zero volt gate-source voltage, the resulting current source provides a temperature-independent current.

In another embodiment, instead of shifting the curve so that the drain current is temperature independent, the curve is shifted so that the current source exhibits a selected amount of temperature dependence.

The present invent can be used in conjunction with either N-channel or P-channel transistors, and either MOSFETs or DMOS FETs.

BRIEF DESCRIPTION OF THE DRAWINGS

FIG. 1 is an IV graph of an ideal current source.

FIG. 2 is an IV graph of a current source constructed in accordance with the prior art.

FIGS. 3a and 3b schematically illustrate prior art current sources using N-channel and P-channel depletion mode transistors, respectively.

FIG. 4 is a graph of the drain current versus drain-source voltage of a typical vertical DMOS FET constructed in accordance with the prior art.

FIG. 5 is a graph of the drain current versus gate voltage for a typical vertical DMOS FET constructed in accordance with the prior art.

FIGS. 6 to 8 illustrate the drain current versus gate-source voltage characteristic curve of a vertical DMOS FET after it has been shifted using a process in accordance with my invention.

FIGS. 9a and 9b illustrate in cross section a DMOS FET during a manufacturing process in accordance with my invention.

FIGS. 10a and 10b illustrate in cross section a MOSFET during a manufacturing process in accordance with my invention.

FIG. 11 illustrates a MOSFET configured to serve as a current source in accordance with an alternate embodiment of my invention.

DETAILED DESCRIPTION

To aid in understanding my invention, FIG. 4 is provided which illustrates the relationship between drain current and the drain-source voltage for a typical vertical DMOS FET constructed in accordance with the prior art. The drain current typically rises to a saturation current which is dependent upon the gate voltage. FIG. 5 is a graph of that saturation current versus gate voltage for the transistor at 125° C., 25° C. and −55° C. The gate voltage required to provide a given drain current is dependent upon temperature. For example, the gate voltage required to provide 4.0 amperes of current at 125° C. is greater than the gate voltage required to provide 4.0 amperes of current at 25° C. The temperature variation in the gate voltage required to provide a given drain current is dependent upon that drain current. For example, for the transistor characteristics of FIG. 5, at 1.5 amperes of drain current, 4.5 volts must be applied across the gate and source regardless of temperature. However for drain currents above 1.5 volts, the higher the temperature, the greater the gate-source voltage will be required to provide a given drain current. For drain currents below 1.5 volts, the lower the temperature, the greater the gate-source voltage required to provide that drain current. The reasons for this phenomenon are well known in the art. The temperature dependence of the relation between drain current and transistor gate voltage is described, for example, in "MOSPOWER Applications Handbook", published by Siliconix incorporated in 1984, pages 5-9 to 5-14, incorporated herein by reference.

I have discovered that by modifying the process used to manufacture a typical DMOS FET, one can shift the curves illustrated in FIG. 5 in the direction of arrow A, thereby providing a transistor, e.g. as characterized by the curve of FIG. 6. The shifting of the curve of FIG. 5 is typically accomplished by implanting charged ions into the gate insulation of a transistor during the manufacturing process, e.g. as described in U.S. Pat. application Ser. No. 06/771,444 entitled "Method for Shifting the Threshold Voltage of DMOS Transistors", filed Aug. 30, 1985, assigned to Siliconix, the assignee of the present invention, and incorporated herein by reference. The transistor of FIG. 6 is a depletion mode transistor which conducts about 1.5 amperes of current when the transistor gate is tied directly to the source and an appropriate voltage within a range of voltages is applied across the source and drain. Further, the transistor drain current does not vary with temperature. Thus, a transistor constructed in accordance with the teachings of this invention and having its gate tied to its source and having the characteristics illustrated in FIG. 6 serves as a current source which will provide 1.5 amperes of current regardless of temperature.

In another embodiment, ions are implanted into the transistor gate insulation to shift the transistor characteristic curve so that drain current decreases as temperature decreases. For example in a transistor having the characteristics illustrated in FIG. 7 and a gate tied to the source, at 125° C. the drain current is about 0.5 amperes, while at −55° C., the drain current is about 0.1 amperes.

In another embodiment, the curve is shifted so that drain current decreases as temperature increases. For example, for a transistor having the characteristics illustrated in FIG. 8 and a gate tied to the source, at −55° C., the drain current is 4.5 amperes but at 125° C., the drain current is 3.0 amperes. Such a transistor is particularly desirable for purposes of avoiding thermal runaway. (Thermal runaway occurs when a temperature increase causes increased drain current, which in turn causes increased heat dissipation, which further increases temperature and drain current. Thermal runaway can cause a transistor current source to fail). By fabricating a transistor in which drain current falls with increased temperature, thermal runaway is avoided.

It will be appreciated in light of the discussion above that the process of the present invention can be used to provide a transistor which exhibits a drain current exhibiting process selectable temperature variation.

The process of the present invention can be used to provide transistors which serve as current sources for any desired current. This is typically done by varying the channel width of the transistor. As is known in the art, the current provided by a current source including a depletion mode transistor having its gate tied to its source is proportional to the transistor channel width. Thus, the current provided by the current source can be controlled by varying the channel width. Therefore, if it is desired to manufacture a transistor having a drain current inversely related to temperature, but which also provides 1 ampere of current at 25° C., one can construct such transistor using the same process steps as the transistor having the characteristics of FIG. 3, except the channel width would be about one quarter of the width of the transistor of FIG. 8.

In accordance with one embodiment of my invention, a plurality of transistors are configured to serve as current sources, each of the current sources providing a current independent of temperature. The plurality of transistors each have different channel widths and therefore each provide different amounts of current. The transistors are also formed on a single integrated circuit. One advantage of such a structure is that if a large amount of power is consumed by one transistor, raising the temperature of the integrated circuit, the currents flowing through the other transistor current sources remain constant.

As mentioned above, a current source constructed in accordance with my invention can be implemented using either MOSFETs or DMOS FETs. FIGS. 9a and 9b illustrate an N-channel DMOS FET Q3 during a manufacturing process in accordance with my invention. Referring to FIG. 9a, P+ deep body regions 12 are formed in an N type substrate 13. Substrate 13 is typically silicon and serves as a drain for the to-be-formed transistor. An insulation layer 14 (typically silicon dioxide) is formed on substrate 13, e.g. by thermal oxidation, and serves as a gate insulation layer. A photoresist mask 15 is applied to insulation layer 14 and then patterned, thereby leaving a window region 15a. Ions are then implanted into the portion of insulation layer 14 within window region 15a. Positive or negative ions can be used during this process, If positive ions such as positive cesium ions are implanted into insulation layer 14, the drain current versus drain-source voltage curve of the resulting N channel transistor is shifted in the direction of arrow A (FIG. 5). If negative ions such as negative iodine ions are implanted into insulation layer 14, the curve is shifted in a direction opposite that of arrow A. In other embodiments of my invention, ions other than iodine or cesium are implanted into insulation layer 14. For example, positive sodium, potassium or rubidium ions, or negative bromine, chlorine, or fluorine. ions can also be implanted into insulation layer 14 to adjust the transistor characteristics.

Referring to FIG. 9b, photoresist layer 15 is removed, and a gate 16 (typically metal such as aluminum and its alloys, polycrystalline silicon, or a silicide) is formed above the portion of insulation layer 14 previously implanted with ions. P type body region 18 and N+ source regions 17 are then formed in substrate 13. Details regarding the process used to form DMOS FET Q3 of FIGS. 9a and 9b are discussed in above-incorporated U.S. Pat. application 06/771,444.

FIGS. 10a and 10b illustrate in cross section a MOSFET Q4 during a manufacturing process in accordance with my invention. Referring to FIG. 10a, a layer of gate insulation 20 is formed on a N type semiconductor substrate 21. Ions are then implanted into gate insulation 20. A photoresist mask 22 is typically formed over gate insulation so that ions are only implanted into the portion of gate insulation 20 above where the transistor channel is to be formed. If positive ions, e.g. positive cesium ions are implanted into gate insulation 20, the drain current versus drain-source voltage curve is shifted in the direction of arrow A (FIG. 5). If negative ions such as negative iodine ions are implanted into gate insulation 20, the curve is shifted in a direction opposite that of arrow A. In other embodiments of my invention, ions other than iodine or cesium are implanted into gate insulation 20. In FIG. 9b, photoresist mask 22 is removed and gate 23 is formed in a conventional manner. Source and drain regions 24 and 25 are then formed, e.g. by ion implantation Details of a method which can be used to complete transistor Q4 are provided, for example, in U.S. Pat. No. 4,450,021, issued to Batra et al. on May 22, 1984, and incorporated herein by reference.

In an alternative embodiment of my invention instead of providing a depletion mode transistor with its source and gate directly connected together, a transistor such as transistor Q5 (FIG. 11) has a gate 30 coupled to its source 31 via a voltage source 32 Voltage source 32 can be a conventional battery. Transistor Q5, acts as a current source when an appropriate voltage is applied across source 31 and drain 33. The current provided by transistor Q5 depends in part on the voltage provided by voltage source 32. The temperature dependence of the current provided by the current source of FIG. 11 is controlled by implanting ions into the gate insulation of transistor Q5 during the manufacturing of transistor Q5. Thus, in accordance with my invention, the gate of a transistor current source can be either tied directly to the transistor source for a depletion mode transistor or tied to the transistor source via a voltage source. Transistor Q5 can be either an enhancement mode or depletion mode transistor.

While the invention has been described with respect to specific embodiments, those skilled in the art will realize that changes can be made to form and detail without departing from the spirit and scope of my invention. For example, the process of the present invention can be used to form P-channel or N-channel transistors. Accordingly, all such changes come within the present invention.

I claim:

1. A method for forming a current source comprising the steps of:
    forming a gate insulation layer on a portion of a surface of semiconductor material;
    introducing ions into said gate insulation layer, said ions retaining their charge;
    forming a gate on said gate insulation layer;
    forming a source region and a drain region within said semiconductor material; and
    electrically connecting said source region to said gate,
        wherein said method further comprises the step of controlling the temperature coefficient of said current source, said step of controlling comprising the step of controlling the number of said ions in said gate insulation layer.

2. A method for forming a current source comprising the steps of:
    forming a gate insulation layer on a portion of a surface of semiconductor material;
    introducing ions into said gate insulation layer, said ions retaining their charge;
    forming a gate on said gate insulation layer;
    forming a source and a body region within said semiconductor material, a portion of said semiconductor material serving as a drain; and
    electrically connecting said source region to said gate,
        wherein said method further comprises the step of controlling the temperature coefficient of said current source, said step of controlling comprising the step of controlling the number of ions in said gate insulation layer.

3. The method of claim 1 or 2 wherein the current provided by said current source is inversely related to temperature.

4. The method of claim 1 or 2 wherein the current provided by said current source is temperature-independent.

5. The method of claim 1 or 2 wherein the current provided by said current source increases in response to an increase in temperature.

6. The method of claim 1 or 2 wherein said ions are positive.

7. The method of claim 1 or 2 wherein said ions are negative.

8. The method of claim 1 or 2 wherein said ions comprise cesium or iodine.

9. A method for forming a current source comprising the steps of:
    forming a gate insulation layer on a portion of a surface of semiconductor material;
    introducing ions into said gate insulation layer, said ions retaining their charge;
    forming a source and drains within said semiconductor material;
    forming a gate on said gate insulation layer; and providing a DC voltage across said gate and source,
        and wherein said method further comprises the step of controlling the temperature coefficient of said current source, said step of controlling comprising said step of controlling the number of said ions in said gate insulation layer.

10. A method for forming a current source comprising the steps of:
    forming a gate insulation layer on a portion of a surface of semiconductor material;
    introducing ions into said gate insulation layer, said ions retaining their charge;
    forming a gate on said gate insulation layer;
    forming a source and body region within said semiconductor material, a portion of said semiconductor material serving as a drain; and
    providing a DC voltage across said gate and source,
        and wherein said method further comprises the step of controlling the temperature coefficient of said current source, said step of controlling comprising the step of controlling the number of ions in said gate insulation layer.

* * * * *

UNITED STATES PATENT AND TRADEMARK OFFICE
CERTIFICATE OF CORRECTION

PATENT NO.    : 4,978,631
DATED         : December 18, 1990
INVENTOR(S)   : Richard A. Blanchard It is certified that error appears in the above-identified patent and that said Letters Patent is hereby corrected as shown below:

Column 2, line 16, "invent" should read --invention--.
Column 6, line 35, Claim 9, "drains" should read --drain--.

Signed and Sealed this

Thirteenth Day of October, 1992

Attest:

DOUGLAS B. COMER

*Attesting Officer*     Acting Commissioner of Patents and Trademarks